(12) United States Patent
Chang et al.

(10) Patent No.: US 9,275,695 B2
(45) Date of Patent: **\*Mar. 1, 2016**

(54) MEMORY DEVICE AND READ OPERATION METHOD THEREOF

(71) Applicant: MACRONIX INTERNATIONAL CO., LTD., Hsinchu (TW)

(72) Inventors: Chin-Hung Chang, Tainan (TW); Chia-Jung Chen, Zhubei (TW); Su-Chueh Lo, Hsinchu (TW); Ken-Hui Chen, Dali (TW); Kuen-Long Chang, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/506,768

(22) Filed: Oct. 6, 2014

(65) Prior Publication Data

US 2015/0023120 A1   Jan. 22, 2015

Related U.S. Application Data

(63) Continuation of application No. 12/907,263, filed on Oct. 19, 2010, now Pat. No. 8,891,313.

(51) Int. Cl.
*G11C 7/12* (2006.01)
*G11C 7/10* (2006.01)
*G11C 7/08* (2006.01)
*G11C 7/18* (2006.01)
*G11C 7/06* (2006.01)

(52) U.S. Cl.
CPC ............... *G11C 7/1048* (2013.01); *G11C 7/06* (2013.01); *G11C 7/08* (2013.01); *G11C 7/106* (2013.01); *G11C 7/12* (2013.01); *G11C 7/18* (2013.01); *G11C 2207/002* (2013.01)

(58) Field of Classification Search
CPC .......... G11C 7/06; G11C 7/08; G11C 7/1048; G11C 7/106; G11C 7/12; G11C 7/18; G11C 2207/002
See application file for complete search history.

(56) References Cited

U.S. PATENT DOCUMENTS

| | | | |
|---|---|---|---|
| 6,937,515 B2 | 8/2005 | Sudo et al. | |
| 7,417,899 B2 | 8/2008 | Lee | |
| 8,120,979 B2 * | 2/2012 | Kim | G11C 11/4091 365/203 |
| 8,891,313 B2 * | 11/2014 | Chang | G11C 7/08 365/185.25 |
| 2008/0013379 A1 | 1/2008 | Lin et al. | |

\* cited by examiner

*Primary Examiner* — Harry W Byrne
*Assistant Examiner* — Lance Reidlinger
(74) *Attorney, Agent, or Firm* — McClure, Qualey & Rodack, LLP

(57) ABSTRACT

A read operation for a memory device is provided. A selected word line, first and second global bit line groups and a selected first bit line group are precharged. A first cell current flowing through the selected word line, the first and the selected first bit line groups is generated. A first reference current flowing through the second global bit line group is generated. A first half page data is read based on the first cell current and the first reference current. The selected word line, the first and the second global bit line groups are kept precharged.

16 Claims, 7 Drawing Sheets

MEMORY DEVICE AND READ OPERATION METHOD THEREOF

CROSS-REFERENCE

This application is a continuation application of U.S. patent application Ser. No. 12/907,263, filed on Oct. 19, 2010, which is now allowed, the subject matter of which is incorporated here for reference.

TECHNICAL FIELD

The present disclosure relates in general to a memory device and a read operation method thereof.

BACKGROUND

In recent years, non-volatile memories that are data-rewritable semiconductor devices are widely used.

In memory reading, an output current is obtained by applying a word line reference voltage to a gate of the memory cell and applying a bit line voltage to source/drain of the memory cell. Then, the output current is compared with a reference current to determine the bit stored in the memory cell.

In memory, sense amplifiers are used for bit reading. For example, for a memory cell of 256 M, it may require 1K (i.e. 1024) sensing amplifiers for data sensing/reading. For reading a page data for example including 256 bits, 256 sensing amplifiers in a SA circuit (for example having 1K sensing amplifiers) concurrently operate for sensing 256 bits. If the memory cell is larger, more sensing amplifiers may be needed. Thus, the circuit area and the current consumption become important issues. Further, during parallel sensing for multiple bits, the common source level may be raised due to large read current flowing through drain sides and accordingly the read margin for sensing erase cells is reduced and thus undesired.

BRIEF SUMMARY

Embodiments of a memory device and a reading operation method thereof are disclosed. During sensing, the charged global bit lines (which are heavy loading) and the charged word lines (which are heavy loading too) are kept charged, for reducing signal line setup (charge) time in page read.

An embodiment of the application provides a read operation for a memory device. A selected word line of an array cell, a first global bit line group, a second global bit line group and a selected first bit line group are precharged. A first cell current flowing through the selected word line, the first global bit line group and the selected first bit line group is generated. A first reference current flowing through the second global bit line group is generated. A first half page data is read based on the first cell current and the first reference current. The selected word line, the first global bit line group and the second global bit line group are kept in a precharged state.

Another embodiment of the application provides a memory device. The memory device includes: an array cell, a first global bit line group, a second global bit line group, a first bit line selector, a second bit line selector and a sensing amplifier circuit. The first bit line selector is coupled to the array cell, for selectively coupling the first global bit line group to the array cell. The second bit line selector is coupled to the array cell, for selectively coupling the second global bit line group to the array cell. The sensing amplifier circuit is coupled to the first and the second bit line selectors. In sensing a first half page data, the first bit line selector is selected so that a selected word line of the array cell, the first global bit line group, the second global bit line group and a selected first bit line group are precharged by the sensing amplifier circuit to generate a first cell current flowing through the selected word line, the first global bit line group and the selected first bit line group and to generate a first reference current flowing through the second global bit line group, and the sensing amplifier circuit reads the first half page data based on the first cell current and the first reference current. The sensing amplifier circuit keeps the selected word line, the first global bit line group and the second global bit line group in a precharged state.

It is to be understood that both the foregoing general description and the following detailed description are exemplary and explanatory only and are not restrictive of the disclosed embodiments, as claimed.

DETAILED DESCRIPTION OF EXEMPLARY EMBODIMENT OF THE PRESENT DISCLOSURE

First Embodiment

Figure 1A:
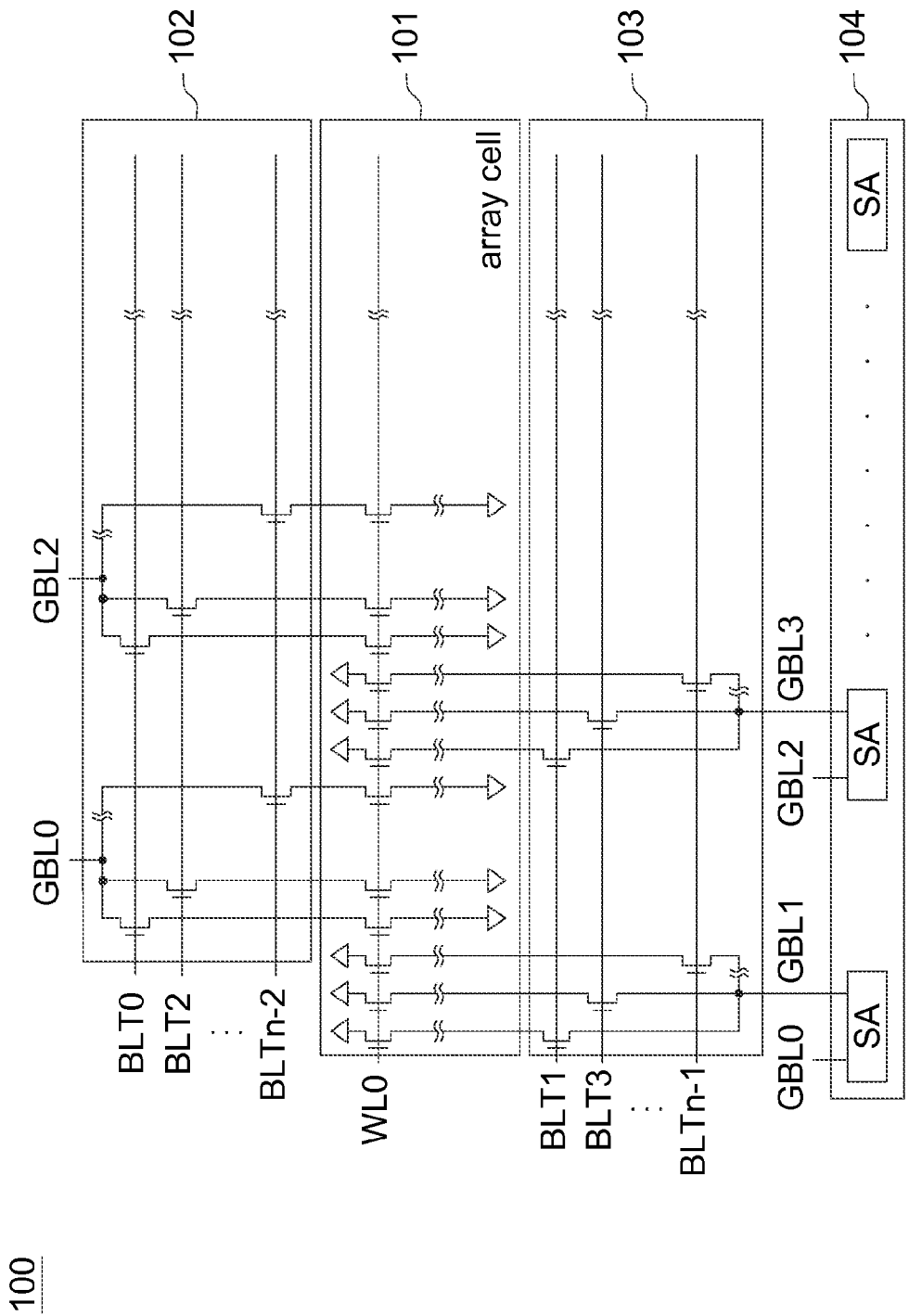
FIG. 1A shows a simplified diagram and FIG. 1B shows a function block diagram of a memory device according to a first embodiment of the disclosure.
Figure 1B:
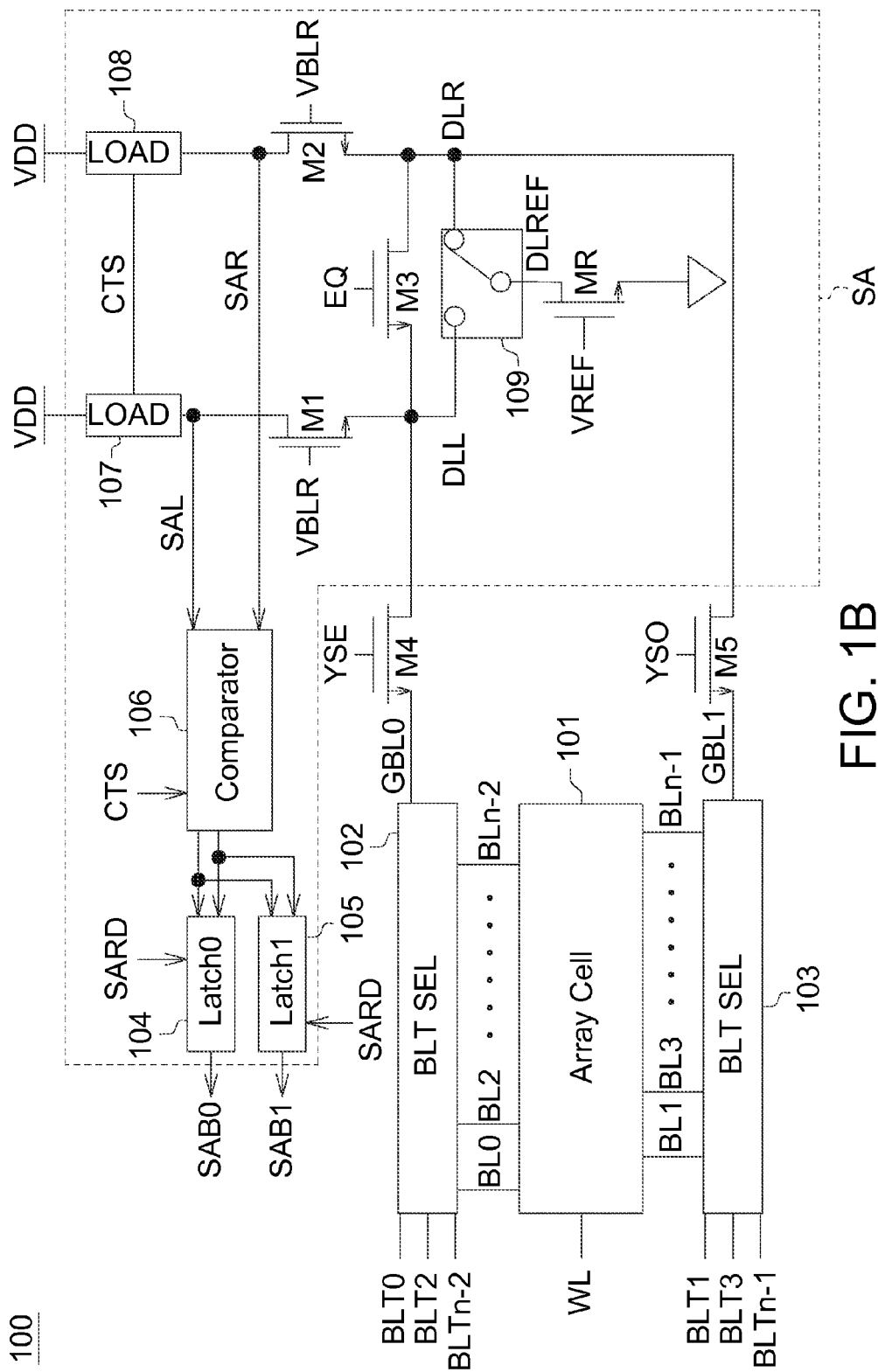

FIG. 1A shows a simplified diagram and FIG. 1B shows a function block diagram of a memory device according to a first embodiment of the disclosure. As shown in FIG. 1A, the memory device 100 according to the first embodiment of the disclosure at least includes an array cell 101, bit line selectors 102~103 and a sensing amplifier circuit 104. The array cell 101 has a plurality of memory cells arranged in an array. The bit line selector 102 includes a plurality of bit line selection transistors for selectively conducting the global bit lines GBL0, GBL 2 ... to the array cell 101 according to the bit line selection signals BLT0, BLT2 ... BLTn−2. Similarly, the bit line selector 103 includes a plurality of bit line selection transistors for selectively conducting the global bit lines GBL1, GBL 3 ... to the array cell 101 according to the bit line selection signals BLT1, BLT3 ... BLTn−1. The sensing amplifier circuit 104 has a plurality of sensing amplifiers SA. Each SA in the SA circuit 104 receives two corresponding global bit lines. The global bit lines are high loads.

Now please refer to FIG. 1B. As shown in FIG. 1B, the SA includes latches 104~105, a comparator 106, loads 107~108, a reference side selector 109 and transistors MR, M1~M3. The memory device 100 further includes transistors M4~M5 (also called as Y-pass gates) connected between the SA and the bit line selectors 102, 103. The transistors M4~M5 select whether the SA is electrically coupled to the bit lines.

The latches 104~105 are coupled to outputs of the comparator 106 for latching outputs from the comparator 106. The comparator 106 compares SAL with SAR for bit sensing. The loads 107~108 are connected between the operation voltage VDD and the transistors M1~M2, respectively. The transistor M1 is connected to the load 107 and the node DLL. The transistor M2 is connected to the load 108 and the node DLR. The signal VBLR controls the transistors M1 and M2. The transistor M3 is connected to the nodes DLL and DLR and controlled by a control signal EQ. In other words, if the transistor M3 is conducted, the sources of the transistors M1 and M2 have the same voltage (i.e. equalized). The transistor M4, as a Y pass gate, is connected between the node DLL and the global bit line GBL0 and is controlled by a control signal YSE; and the transistor M5, also as a Y pass gate, is connected between the node DLR and the global bit line GBL1 and is controlled by a control signal YSO. The transistors M4 and M5 control the connection between the global bit lines and the sensing amplifier. The reference side selector 109 switches one of the nodes DLL and DLR to the reference node DLREF. The transistor MR is connected between nodes DLREF and GND and controlled by a control signal VREF. If the bit line selector 102 is selected, then the reference side selector 109 connects the node DLR to the node DLREF so that the global bit line GBL1 functions as a reference loading; and on the contrary, if the bit line selector 103 is selected, then the reference side selector 109 connects the node DLL to the node DLREF so that the global bit line GBL0 functions as a reference loading. By so, the equivalent loading for the nodes DLL and DLR are almost matched.

During sensing, the global bit lines GBL0 is charged to high, via the loads 107 and the transistors M1 and M4; and similarly, the global bit lines GBL1 is charged to high, via the loads 108 and the transistors M2 and M5. Let assume that the bit line selector 102 is selected but the bit line selector 103 is not selected. Then, the selected local bit line BL0 is charged via the charged global bit line GBL0 (because it is connected to the charged global line GBL0) but the non-selected local bit lines are not charged due to they are disconnected from the global bit lines GBL1. Then, depending on bits stored in the memory cell connected to the selected local bit BL0, a sensing current is flow on the current path having the load 107, the transistor M1 and the transistor M4; and a reference current is flow on another current path having the load 108, the transistor M2 and the reference transistor MR (which is controlled by the control signal VREF). The comparator 106 compares SAL with SAR for bit sensing. The latches 104 and 105 latch the signals output from the comparator 106 as output signals SAB0/SAB1.

Figure 2:
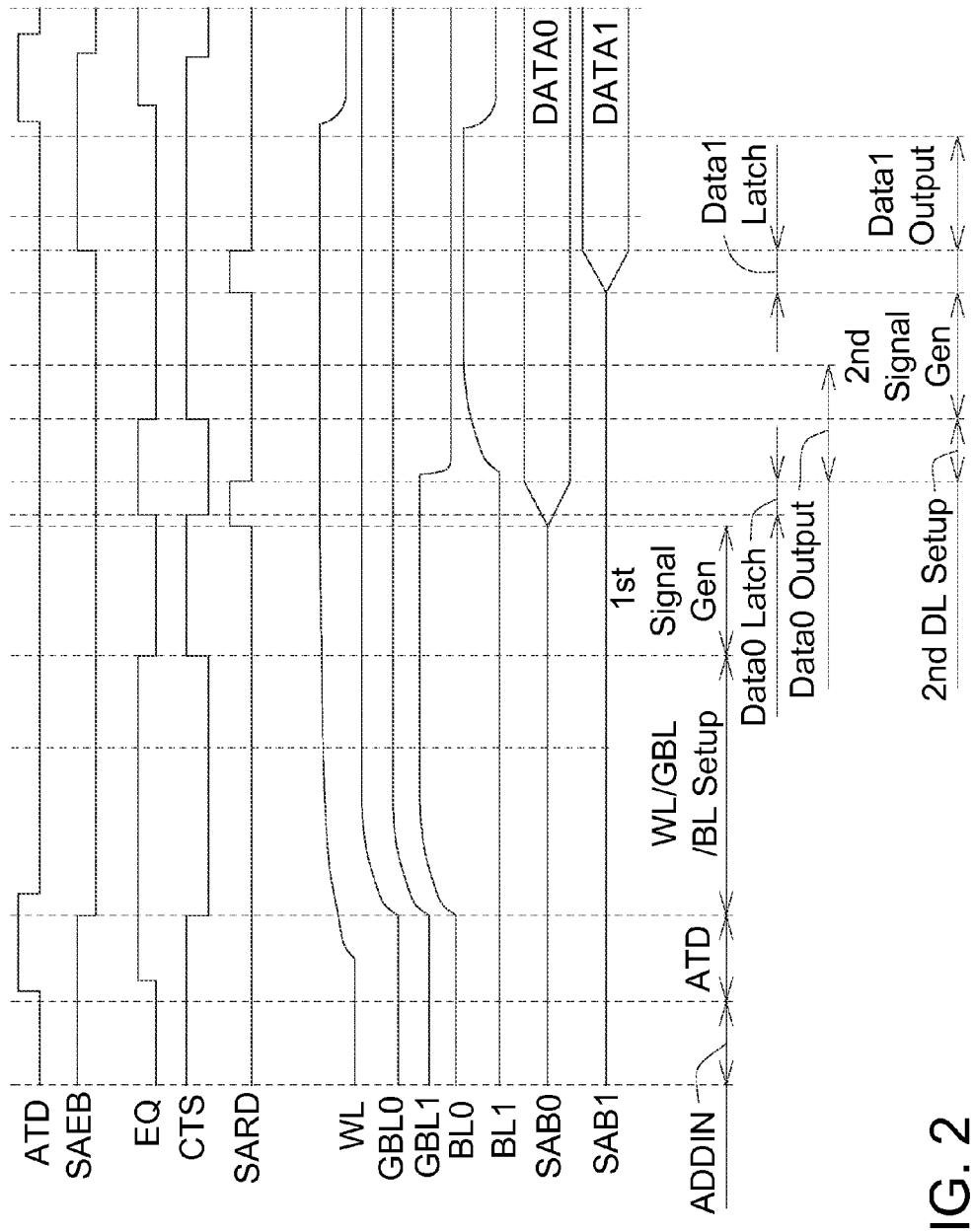
FIG. 2 shows a timing waveform of the memory device according to the first embodiment.

The timing waveform of the memory device according to the first embodiment is shown in FIG. 2. Operations of the memory device according to the first embodiment is described with reference to FIG. 1A, FIG. 1B and FIG. 2.

At the ADDIN (Address input) phase, the user address is input. At the ATD (Address Transition Detection) phase, the signal ATD is asserted if the user input address indicates to read data from a different page. If the signal ATD is asserted, then the signal SAEB is asserted for enabling the sensing amplifier.

At the WL/GBL/BL setup phase, the signal CTS goes low but the control signals YSE and YEO both go high. Assume the address input is to select the bit line selector 102, the bit line selection signal BLT0 is high and the global bit lines GBL0~GBL1 and the local bit line BL0 are charged to the desired voltage. The loads 107~108 and the transistors M1~M2 are used for precharging the corresponding global bit lines and accordingly they may refer to a precharge circuit.

At the "1st signal Gen" phase, the signal CTS goes high but the signal EQ goes low, an output current (or a cell current) is generated on the current path flowing through the load 107, the transistor M1 and the transistor M4; and a reference current is generated on the current path flowing through the load 108, the transistor M2 and the transistor M5. The cell current and the reference current generate the SAL level and the SAR level, respectively. The comparator 103 compares SAL with SAR for bit sensing.

At the "Data0 Latch" phase, the signal SARD goes high and the sensing result output from the comparator 106 is latched by the latch 104. Besides, the bit line selection is switched to the bit line selector 103 to select the second local bit line BL1 for setting up (i.e. charging) the bit line BL1. The reference side selector 109 switches to connect the node DLREF to DLL so that the charged global bit line GBL0 (which is not discharged yet) is as a reference loading.

At the "BL setup" phase after "Data0 Latch" phase, the selected local bit line BL1 is charged, the local bit line BL0 is discharged but the global bit lines GBL0~GBL1 is kept in charged state. In the first embodiment, during the "BL setup" phase, the word line WL and the global bit lines are kept charged even if the page read is switched from reading a first half page to reading a second half page. Therefore, for reading the second half page data, the high-loading signal lines, i.e. the global bit lines GBL0~GBL1 (connected to the same sensing amplifier) and the selected word line WL, are kept in charge state. So, the signal line setup phase (i.e. the BL setup phase) for reading the second half page is shorter.

At the "Data0 Output" phase, the sensing bit stored in the memory cell connected to the selected bit line BL0 is output from the sensing amplifier SA to a next stage (for example a multiplexer) for outputting.

At the "2nd signal Gen" phase, the comparator 106 compares SAL with SAR for sensing the bit stored in memory cell connected to the selected bit line BL1.

At the "Data1 Latch" phase, the signal SARD goes high and then the sensing result from the comparator 106 is latched by the latch 105.

At the "Data1 Output" phase, the sensing bit stored in the memory cell connected to the selected bit line BL1 is output from the sensing amplifier SA for outputting. In other words, in the first embodiment, in reading data from the same page, the BLT selector 102 and 103 are switched alternatively.

In the prior art, for parallel sensing for reading a page data having 256 bits, it may require 256 sensing amplifiers for concurrently sensing, which causes high power consumption, raise the source side effect and suffer from the reduced reading margin. However, as discussed above, in the first embodiment, for parallel sensing for reading a page data of 256 bits, it requires 128 sensing amplifiers for concurrently sensing, and accordingly, the power consumption is lower. Further, the SA circuit senses 128 cells at the same time, so the total source current during sensing is decreased and the source side effect is diminished.

Figure 3:
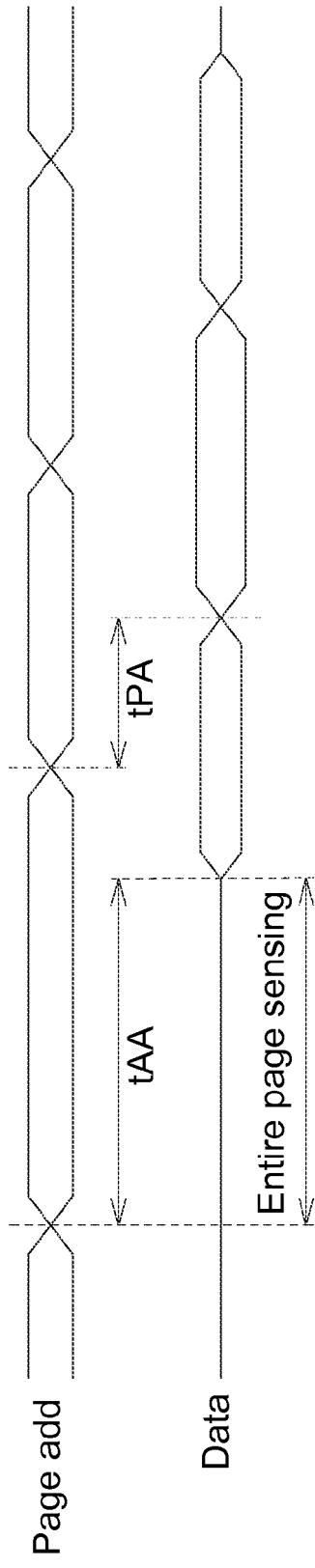
FIG. 3 shows the waveform of page reading according to the prior art.

FIG. 3 shows the waveform of page reading according to the prior art. "tAA" refers to valid data output after the user input address (Page add) indicates to read data from a different page; and "tPA" is page access time. In other words, "tAA" refers to the period from the address transition timing (i.e. the user input address indicating to read data from a different page) to the data fetch timing. In the prior art, for example, for parallel sensing for reading a page data of 256 bits, 256 sensing amplifiers sense at the same time during "tAA" period (i.e. 1 whole page is sensed during "tAA" period).

Figure 4:
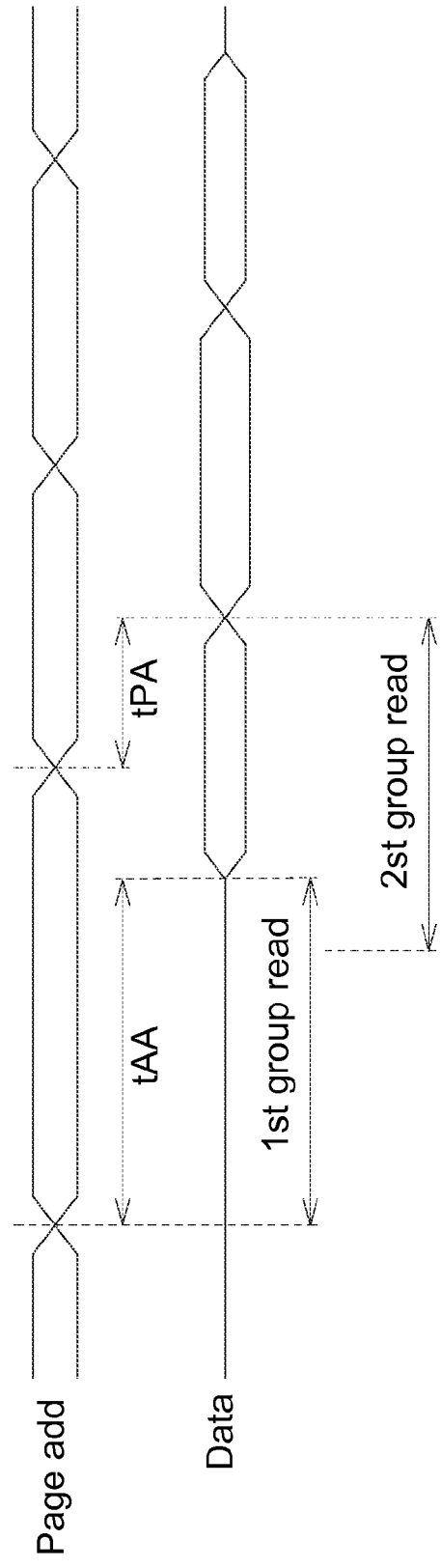
FIG. 4 shows the waveform of page reading according to the first embodiment of the disclosure.

FIG. 4 shows the waveform of page reading according to the first embodiment of the disclosure. The bits of the page are divided to two groups. The first group read (i.e. the first half page read) refers to read of the half page containing the bits which the user assigns and the second group read (i.e. the second half page read) refers to read of the other half page. The two groups are sensed with pipeline. The first group read is accomplished within "tAA" and the total access time for reading the whole page is tAA+tPA. Therefore, reading the first half page which the user assigns can meet the reading timing requirement (i.e. "tAA") while reading the second half page can also meet the reading timing requirement (i.e. "tAA"+"tPA").

Further, the first embodiment of the disclosure has another reading operation method. Assume the first half page reading (containing the bits assigned by the user input address) selects the bit line selector 102 and the bit line BL0. The second half page reading (not containing the bits assigned by the user input address) also selects the bit line selector 102 and another bit line BL2. Then, during the BL setup phase in FIG. 2, the selected bit line BL2 is setup (charged). Also, the reference side selector 109 still connects the node DLR to the node DLREF. In other words, during sensing the same page, one of the global bit lines between GBL0~GBL1 is always acting as a drain side for connecting the selected bit line to the comparator 103 while the other one of the global bit lines between GBL0~GBL1 is always acting as a reference loading for loading matching. That is, during reading the same page, the bit line selector is not switched.

Second Embodiment

Figure 5:
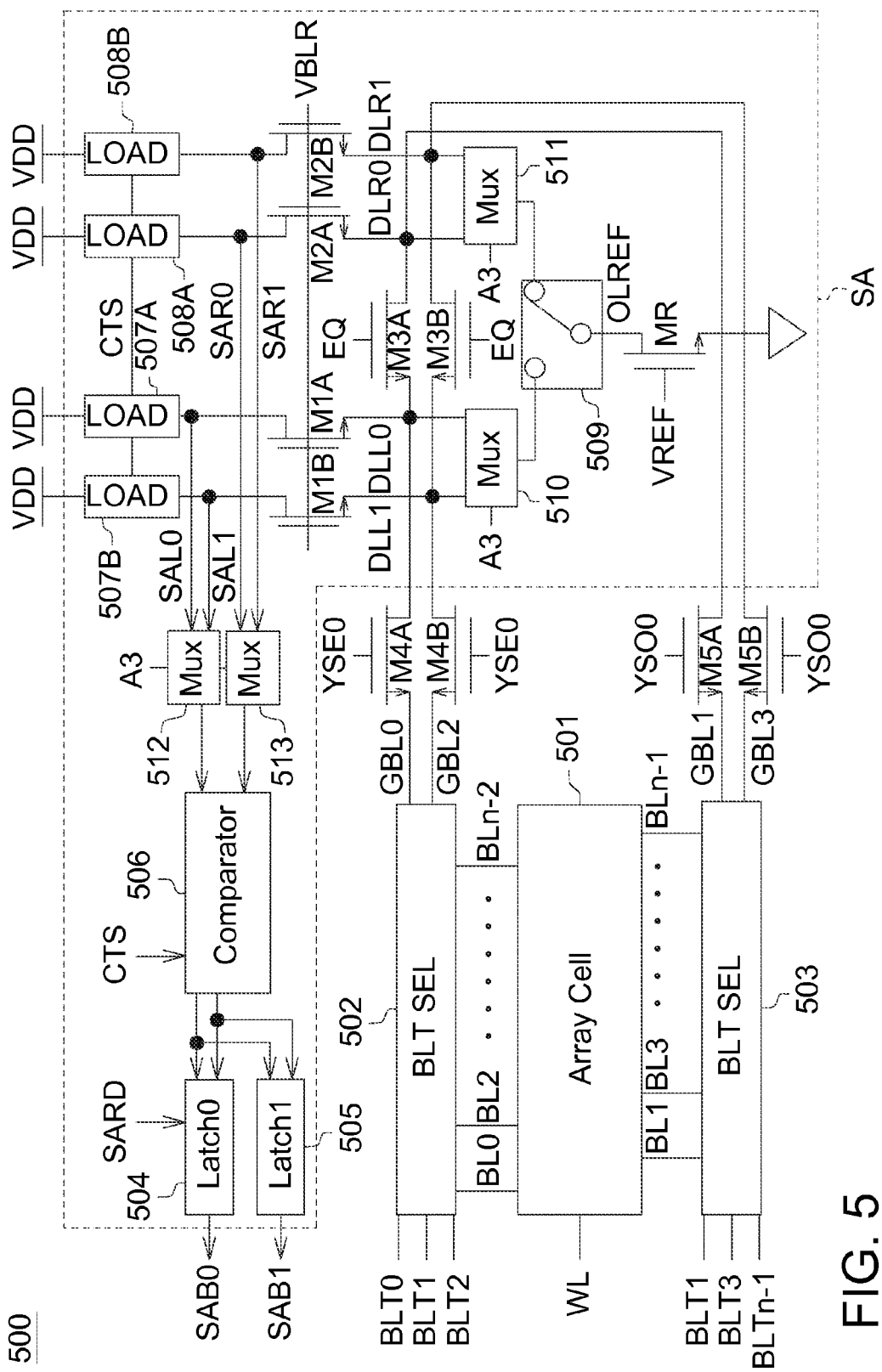
FIG. 5 shows a function block diagram of a memory device according to a second embodiment of the disclosure.

FIG. 5 shows a function block diagram of a memory device according to a second embodiment of the disclosure. As shown in FIG. 5, the memory device 500 according to the second embodiment of the disclosure at least includes an array cell 501, bit line selectors 502~503 and a sensing amplifier circuit (not shown). The SA includes latches 504~505, a comparator 506, loads 507A~508B, a reference side selector 509, multiplexers 510~513 and transistors MR, M1A~M3B. The array cell 501, the bit line selectors 502~503, the latches 504~505, the comparator 506, the loads 507A~508B, the reference side selector 509 and the transistors MR, M1A~M5B are the same or similar to that in the first embodiment and thus their details are omitted. The control signal A3 controls the MUXs 510~513 for the first half page reading and for the second half page reading.

Figure 6:
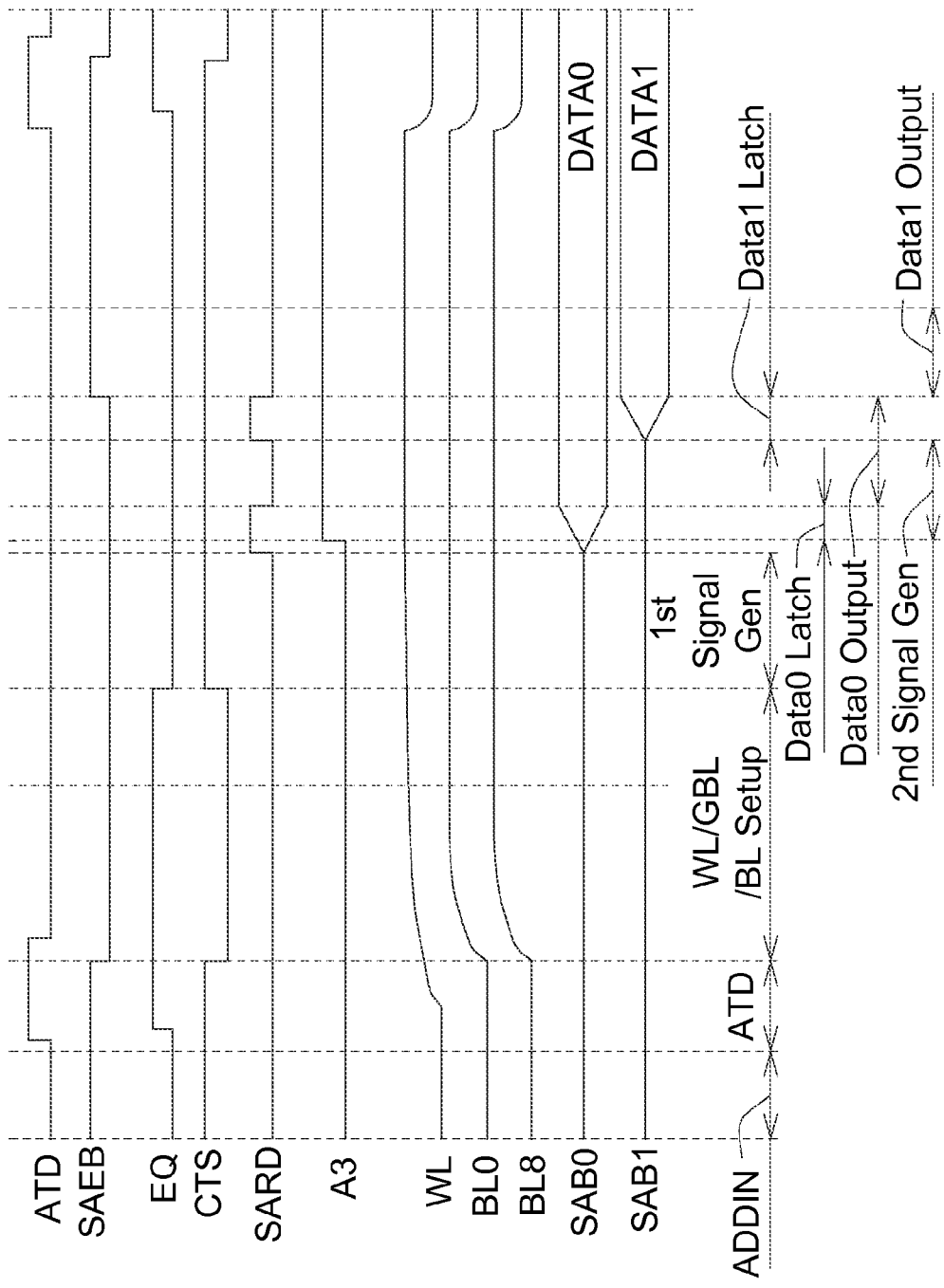
FIG. 6 shows a timing waveform of the second embodiment of the disclosure.

The timing waveform of the second embodiment 500 of the disclosure is shown in FIG. 6.

At the WL/GBL/BL setup phase, the control signal CTS goes low, and the control signals EQ, YSE0 and YSO0 go high. Assume the user address input is to select to the bit line selector 502, the bit line selection signal BLT0 is high and the global bit lines GBL0~GBL3 and the local bit lines BL0 and BL8 are charged to the desired voltage (assuming that the global bit line GBL0 and GBL1 are connected to the selected local bit lines BL0 and BL8, respectively). In other words, in the second embodiment, each sense amplifier charges two bit lines at the same time and the control signal A3 controls the multiplexers 510~513 for the first half page sensing and the second half page sensing.

In details, in the "WL/GBL/BL setup" phase and in the "1st Signal Gen" phase, the transistors M1A~M5B are all on; the MUX 510 connects the node DLL1 to the reference side selector 509; the MUX 511 is operated so that the node DLR0 is connected to the DLREF via the MUX 511 and the reference side selector 509; the reference side selector 509 connects the MUX 511 to the transistor MR; the MUX 512 selects SAL0 and the MUX 513 selects SAR0. In other words, in sensing the first half page, the comparator senses SAL0 with SAR0.

In the ""2nd Signal Gen" phase, the control signal A3 is transited, so that the MUX 510 connects the node DLL0 to the reference side selector 509; the MUX 511 is operated so that the node DLR1 are connected to the DLREF via the MUX 511 and the reference side selector 509; the reference side selector 509 connects the MUX 511 to the transistor MR; the MUX 512 selects SAL1 and the MUX 513 selects SAR1. In other words, in sensing the second half page, the comparator senses SAL1 with SARI. In the second embodiment, in reading data from the same page, the BLT selector 502 and 503 are not switched.

Comparing FIG. 2 and FIG. 6, in the second embodiment, the BL setup phase after the "Data0 Latch" phase is removed because the selected local bit line BL8 (for the second half page reading) is already charged. Therefore, the sensing speed is faster in the second embodiment than in the first embodiment.

Also, In the prior art, for parallel sensing for reading a page data of 256 bits, it may require 256 sensing amplifiers for concurrently sensing, which causes high power consumption, raises the source side effect and suffers from the reduced reading margin. However, as discussed above, in the second embodiment, for parallel sensing for reading a page data of 256 bits, it requires 128 sensing amplifiers for concurrently sensing and the power consumption is lower; and further, the number of cells which are sensed at the same time are 128, so the total source current during sensing is decreased and the source side effect is diminished.

Also, in the second embodiment, assume the first half page reading (containing the bits assigned by the user input address) selects the bit line selector 502 and the bit line BL0. The second half page reading (not containing the bits assigned by the user input address) selects the bit line selector 502 and another bit line BL8. In other words, during sensing for the same page, the bit line selectors are not switched.

Third Embodiment

Figure 7:
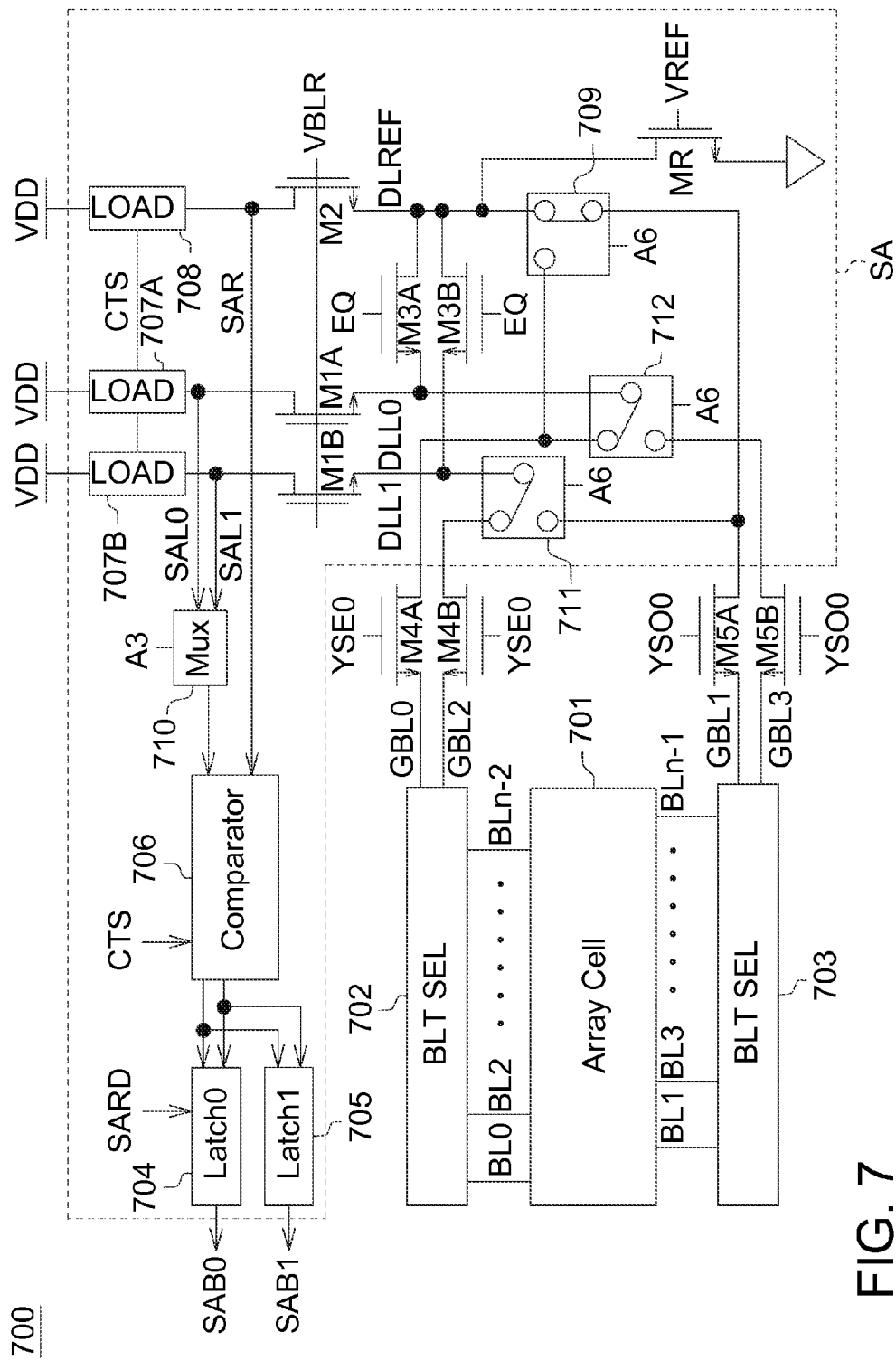
FIG. 7 shows a function block diagram of a memory device according to a third embodiment of the disclosure.

FIG. 7 shows a function block diagram of a memory device according to a third embodiment of the disclosure. As shown in FIG. 7, the memory device 700 according to the third embodiment of the disclosure at least includes an array cell 701, bit line selectors 702~703 and a sensing amplifier circuit (not shown). The SA includes latches 704~705, a comparator 706, loads 707A~708, a reference side selector 709, multiplexers 710~712 and transistors MR, M1A~M3B. The SA in the third embodiment has similar structure and operation to that in the second embodiment and thus the details are omitted. The control signal A6 controls the reference side selector 709 and the multiplexers 711~712. During read operation, the signals YES0 and YEO0 are both high. If the control signal is L, the node DLL0 is connected to the global bit line GBL0 via the MUX 712; the node DLL1 is connected to the global bit line GBL2 via the MUX 711; and the node DLREF is connected to the global bit line GBL1 via the reference side selector 709. On the contrary, if the control signal is H, the node DLL0 is connected to the global bit line GBL3 via the MUX 712; the node DLL1 is connected to the global bit line GBL1 via the MUX 711; and the node DLREF is connected to the global bit line GBL0 via the reference side selector 709.

The timing waveform of the third embodiment 700 of the disclosure is the same as shown in FIG. 6.

At the WL/GBL/BL setup phase, the control signal CTS goes low, and the control signals EQ, YSE0 and YSO0 go high. Assume the user address input is to select to the bit line selector 702, the bit line selection signal BLT0 is high and the global bit lines GBL0~GBL3 and the local bit lines BL0 and BL8 are charged to the desired voltage (assuming that the global bit line GBL0 and GBL1 are connected to the selected local bit lines BL0 and BL8, respectively). In other words, in the third embodiment, each sense amplifier charges two bit lines at the same time and the control signal A3 controls the multiplexer 710 for the first half page sensing and the second half page sensing.

In details, in the "WL/GBL/BL setup" phase and in the "1st Signal Gen" phase, the transistors M1A~M5B are all on; the node DLL0 is connected to the global bit line GBL0 via the MUX 712; the node DLL1 is connected to the global bit line GBL2 via the MUX 711; and the node DLREF is connected to the global bit line GBL1 via the reference side selector 709. The MUX 710 selects SAL0 so that in sensing the first half page, the comparator senses SAL0 with SAR.

In the ""2nd Signal Gen" phase, the control signal A3 is transited, so that the MUX 710 selects SAL0; the node DLL0 is connected to the global bit line GBL3 via the MUX 712; the node DLL1 is connected to the global bit line GBL1 via the MUX 711; and the node DLREF is connected to the global bit line GBL0 via the reference side selector 709. In other words, in sensing the second half page, the comparator senses SAL1 with SAR. In the third embodiment, in reading data from the same page, the BLT selectors 702 and 703 are not switched.

Also, in the third embodiment, the BL setup phase after the "Data0 Latch" phase is removed because the selected local bit line BL8 (for the second half page reading) is already charged. Therefore, the sensing speed is faster in the third embodiment than in the first embodiment.

Also, In the prior art, for parallel sensing for reading a page data of 256 bits, it may require 256 sensing amplifiers for concurrently sensing, which causes high power consumption, raises the source side effect and suffers from the reduced reading margin. However, as discussed above, in the third embodiment, for parallel sensing for reading a page data of 256 bits, it requires 128 sensing amplifiers for concurrently sensing and the power consumption is lower; and further, the number of cells which are sensed at the same time are 128, so the total source current during sensing is decreased and the source side effect is diminished.

Also, in the third embodiment, assume the first half page reading (containing the bits assigned by the user input address) selects the bit line selector 702 and the bit line BL0. The second half page reading (not containing the bits assigned by the user input address) selects the bit line selector 702 and another bit line BL8. In other words, during sensing the same page, the bit line selectors are not switched.

The interleaving read operation methods and the structures according to the above embodiments of the disclosure are not restricted to the parallel sensing application; and they may also be applied to any other sensing operation.

It will be appreciated by those skilled in the art that changes could be made to the disclosed embodiments described above without departing from the broad inventive concept thereof. It is understood, therefore, that the disclosed embodiments are not limited to the particular examples disclosed, but is intended to cover modifications within the spirit and scope of the disclosed embodiments as defined by the claims that follow.

What is claimed is:

1. A read operation method for a memory device, the method comprising:

precharging a selected word line of an array cell, a first global bit line group, a second global bit line group and a selected first bit line group;

generating a first cell current flowing through the array cell, the first global bit line group and the selected first bit line group, and generating a first reference current flowing through the second global bit line group;

reading a first half page data based on the first cell current and the first reference current; and keeping the selected word line, the first global bit line group and the second global bit line group in a precharged state.

2. The read operation method according to claim 1, wherein the precharging step is performed in response to an input address indicating to read data from a different page.

3. The read operation method according to claim 1, further comprising:

generating a second cell current flowing through the array cell, and generating a second reference current; and reading a second half page data based on the second cell current and the second reference current.

4. The read operation method according to claim 3, wherein in sensing the second half page data, the second cell current further flows through the array cell, a selected second bit line group and the second global bit line group; and the first global bit line group is as a loading for the second reference current.

5. The read operation method according to claim 4, further comprising:

after the first half page data is latched, a selected second bit line group is precharged and the selected first bit line group is discharged.

6. The read operation method according to claim 3, wherein in sensing the second half page data, the second cell current further flows through the array cell, the selected first bit line group and the first global bit line group; and the second global bit line group is as a loading for the second reference current.

7. The read operation method according to claim 3, wherein in sensing the second half page data, the second cell current further flows through the array cell, the selected first bit line group and the first global bit line group; and the second global bit line group is as a loading for the second reference current.

8. The read operation method according to claim 7, wherein in sensing the first half page data and the second half page data, the selected first bit line group is kept in a precharge state.

9. A memory device, including:

an array cell;

a first global bit line group;

a second global bit line group;

a first bit line selector, coupled to the array cell, for selectively coupling the first global bit line group to the array cell;

a second bit line selector, coupled to the array cell, for selectively coupling the second global bit line group to the array cell; and a sensing amplifier circuit, coupled to the first and the second bit line selectors;

wherein in sensing a first half page data, the first bit line selector is selected so that a selected word line of the array cell, the first global bit line group, the second global bit line group and a selected first bit line group are precharged by the sensing amplifier circuit to generate a first cell current flowing through the array cell, the first global bit line group and the selected first bit line group and to generate a first reference current flowing through the second global bit line group, and the sensing amplifier circuit reads the first half page data based on the first cell current and the first reference current; and the sensing amplifier circuit keeps the selected word line, the first global bit line group and the second global bit line group in a precharged state.

10. The memory device according to claim 9, wherein the first half page data is sensed if the memory device receives an input address indicating to read data from a different page.

11. The memory device according to claim 9, wherein in sensing a second half page data, the sensing amplifier circuit generates a second cell current flowing through the array cell and generates a second reference current, and the sensing amplifier circuit reads the second half page data based on the second cell current and the second reference current.

12. The memory device according to claim 11, wherein in sensing the second half page data, the second bit line selector is selected so that the sensing amplifier circuit generates the second cell current further flowing through the array cell, a selected second bit line group and the second global bit line group, and the first global bit line group is as a loading for the second reference current.

13. The memory device according to claim 12, wherein after the first half page data is latched by the sensing amplifier circuit, the second bit line selector is selected so that a selected second bit line group is precharged and the selected first bit line group is discharged.

14. The memory device according to claim 12, wherein in sensing the second half page data, the first bit line selector is selected so that the sensing amplifier circuit generates the second cell current further flowing through the array cell, the selected first bit line group and the first global bit line group; and the second global bit line group is as a loading for the second reference current.

15. The memory device according to claim 12, wherein in sensing the second half page data, the first bit line selector is selected so that the sensing amplifier circuit generates the second cell current further flowing through the array cell, the selected first bit line group and the first global bit line group; and the second global bit line group is as a loading for the second reference current.

16. The memory device according to claim 15, wherein in sensing the first half page data and the second half page data, the first bit line selector is selected so that the selected first bit line group is kept in a precharge state.

* * * * *